United States Patent
Wu et al.

(10) Patent No.: US 6,846,687 B2
(45) Date of Patent: Jan. 25, 2005

(54) PROCESS OF PACKAGING ORGANIC ELECTROLUMINESCENT PANEL

(75) Inventors: Chin-Long Wu, Tainan (TW); Tung-Yang Tang, Hsinchu (TW); Shih-Ming Hsu, Miaoli (TW); Shang-Wei Chen, Jubei (TW)

(73) Assignee: RiTdisplay Corporation, Hsinchu (TW)

( * ) Notice: Subject to any disclaimer, the term of this patent is extended or adjusted under 35 U.S.C. 154(b) by 0 days.

(21) Appl. No.: 10/692,473

(22) Filed: Oct. 22, 2003

(65) Prior Publication Data

US 2004/0123455 A1 Jul. 1, 2004

(30) Foreign Application Priority Data

Oct. 22, 2002 (TW) ........................................ 91124307 A

(51) Int. Cl.⁷ .............................................. H01L 21/00
(52) U.S. Cl. ............................ 438/22; 438/25; 438/26; 438/29; 438/34; 257/81; 257/88; 257/79; 257/99
(58) Field of Search ...................... 257/81, 88, 79–103; 438/22, 25, 26, 28, 29, 30, 34; 361/735–736, 767, 790

(56) References Cited

U.S. PATENT DOCUMENTS

| | | | | | |
|---|---|---|---|---|---|
| 5,747,363 | A | * | 5/1998 | Wei et al. ....................... | 438/5 |
| 5,869,929 | A | * | 2/1999 | Eida et al. ................... | 313/501 |
| 6,180,960 | B1 | * | 1/2001 | Kusuda et al. ................ | 257/91 |
| 6,496,973 | B1 | * | 12/2002 | Kusuda et al. ................ | 716/19 |
| 6,583,442 | B2 | * | 6/2003 | Ito ............................... | 257/79 |
| 6,621,213 | B2 | * | 9/2003 | Kawashima ................ | 313/506 |
| 6,727,519 | B1 | * | 4/2004 | Wu ............................. | 257/81 |
| 2002/0084536 | A1 | * | 7/2002 | Sundahl et al. ............. | 257/784 |
| 2003/0141807 | A1 | * | 7/2003 | Kawase ...................... | 313/498 |

* cited by examiner

Primary Examiner—Amir Zarabian
Assistant Examiner—Thanh Y. Tran
(74) Attorney, Agent, or Firm—J.C. Patents

(57) ABSTRACT

A process of packaging an OEL panel is disclosed. A printed circuit board is provided, wherein the printed circuit board comprises a plurality of bonding pads and a plurality of bumps on the bonding pads. Next, at least one OEL panel having a plurality of polysolder interconnections is provided. Next, the OEL panel disposed on the printed circuit board. A reflow process is performed so that the OEL panel can electrically connect with the PCB by the polysolder interconnections. Because of the low-temperature reflow process, the process of packaging an OEL panel can be accomplished by a low temperature process.

15 Claims, 14 Drawing Sheets

PROCESS OF PACKAGING ORGANIC ELECTROLUMINESCENT PANEL

CROSS-REFERENCE TO RELATED APPLICATION

This application claims the priority benefit of Taiwan application serial no. 91124307, filed on Oct. 22, 2002.

BACKGROUND OF THE INVENTION

1. Field of the Invention

The present invention relates to a process of packaging an organic electroluminescent panel, and more particularly to a process of packaging an organic electroluminescent panel having a polysolder interconnection array.

2. Description of the Related Art

An organic electroluminescent (OEL) device includes two electrodes and an electroluminescent layer between the electrodes. When a current or voltage is applied to the device, holes from the anode will recombine with electrons from the cathode within the emitting layer and excite the molecules therein to the excited state. When the excited molecules release energy and return back to the ground state, a portion of energy generated therefrom will be released in the form of light. Because of its self-luminescence, wide viewing angle, fast response speed, low driving voltage, and full-color, the organic electroluminescent panel has become the mainstream of the display. To date, the organic electroluminescent panel have been implemented and applied to the next generation full color display, such as computers or televisions. However, the organic electroluminescent panel should still be improved for mass production of commercialization.

Referring to FIG. 1, a schematic drawing showing a prior art package structure of the organic electroluminescent panel is shown. U.S. Pat. No. 5,747,363 disclosed a package structure of the organic electroluminescent panel, which includes an organic electroluminescent panel 100 and a substrate 108. The organic electroluminescent panel 100 comprises a plurality of stripes of anodes 102, an organic electroluminescent layer 104 and a plurality of stripes of cathodes 106. The substrate 108 includes driving integrated circuits 112 and pins 110. The pins of the substrate 108 are electrically connected to the anodes 102 and cathodes 106 of the organic electroluminescent panel 100 by conductive paste.

The prior art package structure of the organic electroluminescent panel can integrate the driving IC therewith; however, it will be confronted with the limitation of size.

Referring to FIG. 2, a schematic drawing showing another prior art package structure of the organic electroluminescent panel is shown. U.S. Pat. No. 5,693,170 disclosed another package structure of the organic electroluminescent panel, which comprises a plurality of panels 200, a substrate 206, and a plurality of bumps or solder balls 210. A plurality of pads 202, which is, for example, electrically connected to the electrodes of the panels 200 by the plugs 204 are disposed on the surface of the panels 200 adjacent to the substrate 206. The substrate 206 has a plurality of pads 208 in response to the pads 202. The bumps 210 are formed between the pads 202 and pads 208 for electrical connection thereof.

The prior art package structure of the organic electroluminescent panel can integrate a plurality of panels and has a large size; however, the high-temperature reflow process for connecting the pads and bumps will result in warpage of the assembly substrate. Moreover, the high-temperature reflow process adversely affects the organic electroluminescent layer of the organic electroluminescent panel.

SUMMARY OF THE INVENTION

Therefore, the object of the present invention is to provide a process of packaging an organic electroluminescent panel, which can reduce the stress of the protective layer and improve the thermal dissipation characteristics.

Another object of the present invention is to provide a process of packaging an organic electroluminescent panel, which can assemble a plurality of organic electroluminescent panels on a printed circuit board for resolving the limitation of package size.

Another object of the present invention is to provide a process of packaging an organic electroluminescent panel, which is a low-temperature and low-stress package process suitable for the low temperature process of organic electroluminescent panels.

In order to achieve the objects described above, the present invention discloses a process of packaging an organic electroluminescent panel. First a printed circuit board, such as a ceramic printed circuit board, is provided, which has a plurality of bonding pads. Bumps are then formed on the bonding pads via a wiring bonder for forming stud bumps. The bumps can be, for example, gold bumps. A filler is formed on the printed circuit board by screen printing, dispensing or coating process. At least one organic electroluminescent panel is provided, which has a polysolder interconnection array thereon and is disposed on the printed circuit board for forming the bumps and the filler between the organic electroluminescent panel and the printed circuit board. A reflow process is performed for electrically connecting the polysolder interconnections with the bumps. The filler is crosslinked by thermal curing or ultraviolet curing.

In the present invention, the organic electroluminescent panel comprises: a transparent substrate, a plurality of anodes, a patterned organic electroluminescent layer, a plurality of cathodes, a protective layer, and a polysolder interconnection array. The anodes are formed on the transparent substrate, wherein each of the anodes has a driving area and at least one connecting area laterally connected to the driving area. The patterned organic electroluminescent layer is formed on the transparent substrate or on the anodes and exposes the connecting area. The cathodes are formed on the organic electroluminescent layer, wherein at least a portion of cathodes exposes the connecting area. The protective layer is formed on the transparent substrate, which has a plurality of first openings for exposing the connecting area and a portion of the cathodes. The polysolder interconnections are formed on exposed connecting area and the portion of the cathode for forming a polysolder interconnection array.

In the present invention, the driving area of the anodes and cathodes on the organic electroluminescent panel are, for example, stripes and the anodes are orthogonal to the cathodes.

In the present invention, the patterned organic electroluminescent layer has, for example, a plurality of openings which expose the connecting area for connection of the anodes. In addition, the patterned organic electroluminescent layer is, for example, stripes for exposing the connecting area and for connection of anodes.

In the present invention, the protective layer is, for example, composed of an organic moisture resistant layer and an inorganic moisture resistant layer. The organic moisture resistant layer is formed from about 1000 nm to 6000 nm and the inorganic moisture resistant layer is formed from about 100 nm to 600 nm. The organic moisture resistant layer is, for example, parylene, fluorine-containing resin or the other polymer. The inorganic moisture resistant layer is, for example, silicon nitride, silicon oxide or aluminum nitride.

In the present invention, the organic electroluminescent panel is, for example, a structure having anodes, a electroluminescent layer and cathodes.

In the present invention, the organic electroluminescent panel is, for example, a structure having anodes, a hole injection layer, a hole transporting layer, an organic electroluminescent layer, an electron transporting layer, an electron injection layer and cathodes.

In the present invention, the anodes are comprised of, for example, indium tin oxide; the cathodes are comprised of, for example, metal. The polysolder interconnections are comprised of, for example, silver paste. The printed circuit board is, for example, a ceramic printed circuit board. The bumps are, for example, gold stud bumps.

In order to achieve the objects of the present invention described above, a method of forming an organic electroluminescent panel is disclosed. First, a transparent substrate is provided, which is comprised of, for example, glass, acrylic or the other transparent material. A plurality of anodes are formed on the transparent substrate, wherein each of the anodes comprises a driving area and at least one connecting area laterally connected to the driving area. A patterned organic electroluminescent layer is formed on the transparent substrate or on the anodes for exposing the connecting area. A plurality cathodes are formed on the organic electroluminescent layer, wherein at least a portion of cathodes exposes the connecting area. A protective layer is formed on the transparent substrate, which has a plurality of openings exposing the connecting area and a portion of the cathodes. Polysolder interconnections are formed on exposed connecting area and the portion of the cathode for forming a polysolder interconnection array, wherein the method of forming the polysolder interconnections comprises, for example, screen printing or dispensing process.

The process of forming an organic electroluminescent panel of the present invention, except the organic electroluminescent layer, the hole injection layer, hole transporting layer, electron transporting layer and electron injection layer can be applied to form a multi-layer structure.

In order to make the aforementioned and other objects, features and advantages of the present invention understandable, a preferred embodiment accompanied with figures is described in detail below.

DESCRIPTION OF SOME EMBODIMENTS

Figure 1:
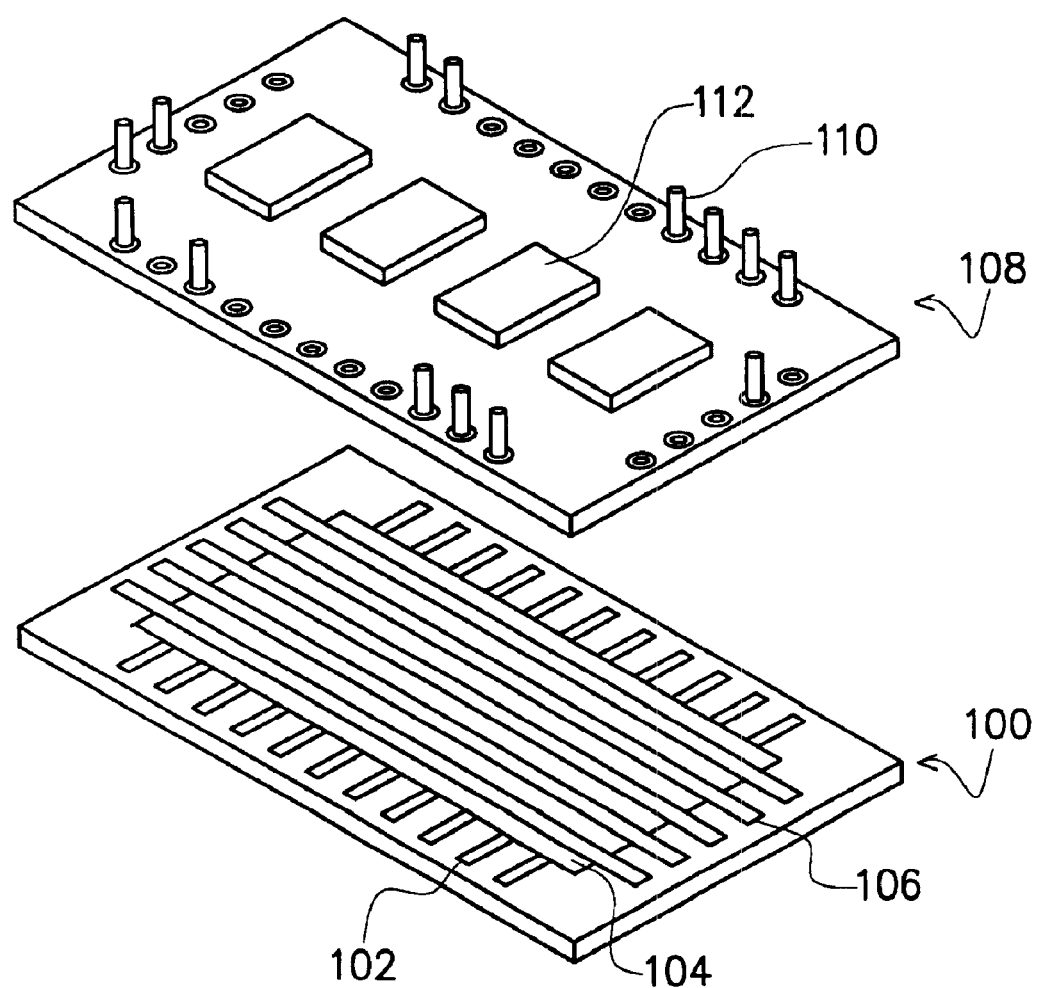
FIG. 1 is a schematic drawing showing a prior art package structure of the organic electroluminescent panel.
Figure 2:
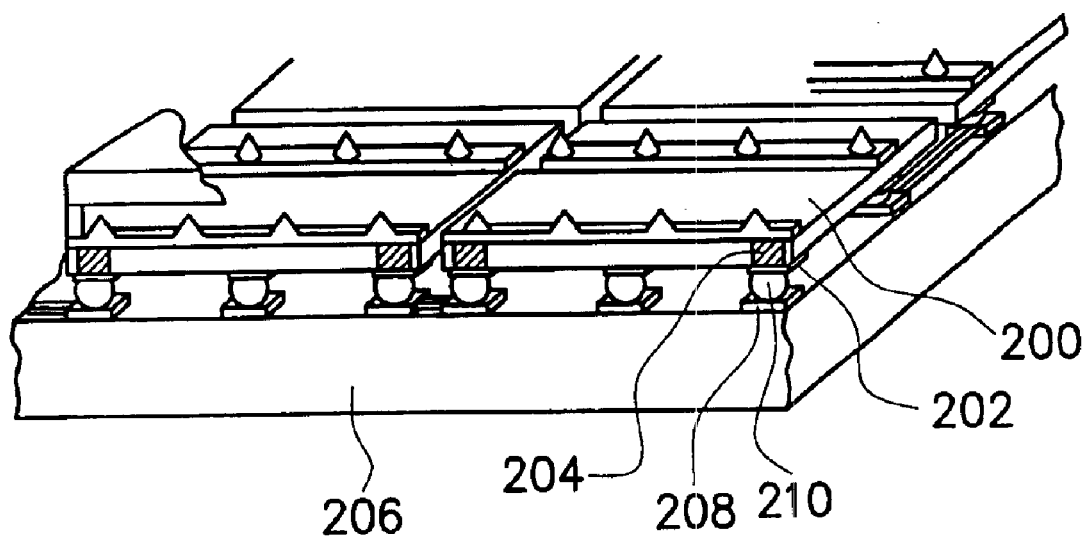
FIG. 2, it is a schematic drawing showing another prior art package structure of the organic electroluminescent panel.
Figure 3:
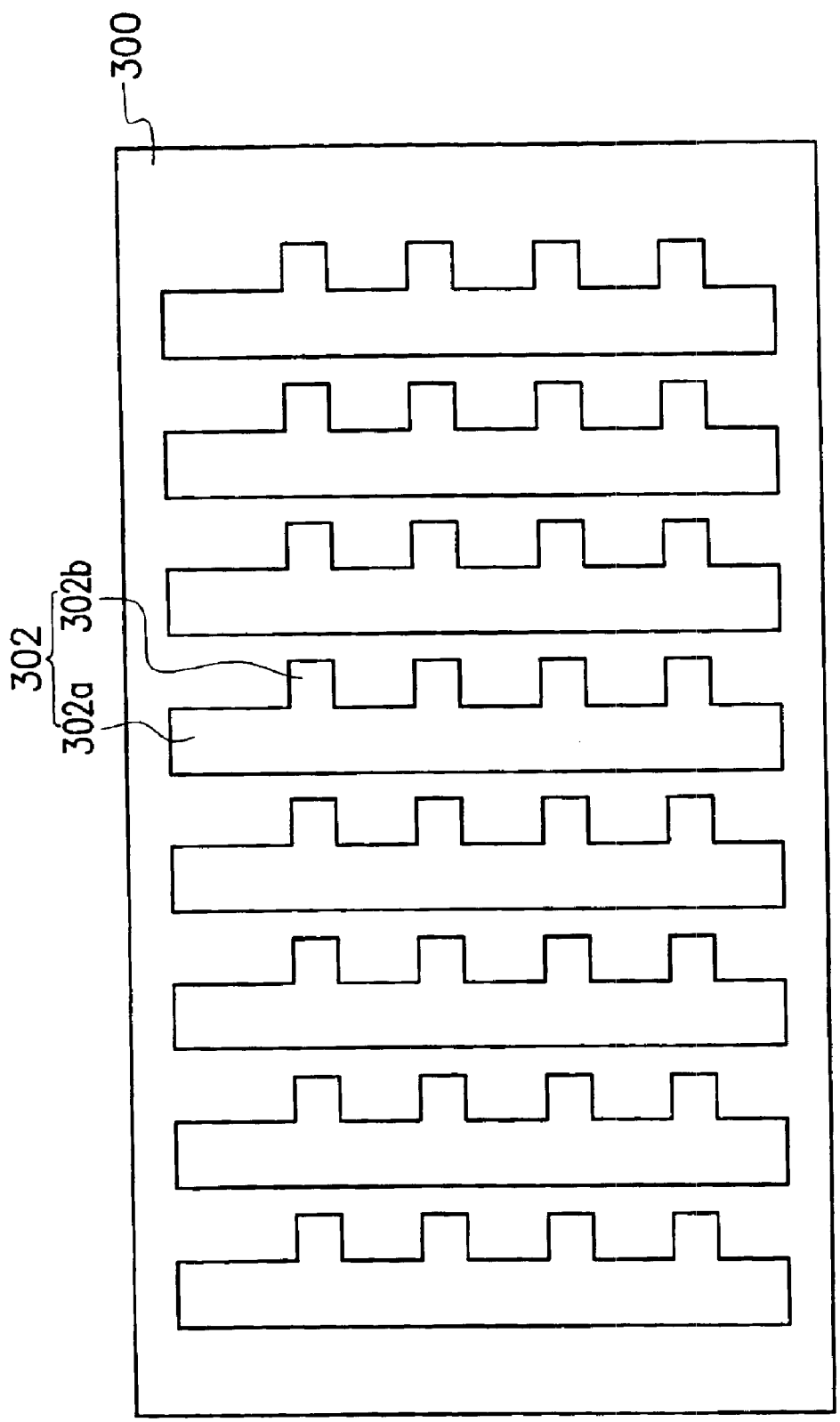
FIGS. 3–6 are schematic views showing the progression steps of a process of forming an organic electroluminescent panel according to a first embodiment of the present invention.

Referring to FIGS. 3–6, schematic views showing progression of steps of a process of forming an organic electroluminescent panel according to a first embodiment of the present invention is shown. Referring to FIG. 3, a transparent substrate 300 is provided, which is comprised of, for example, glass, acrylic or the other transparent material. A plurality of anodes 302 are formed on the transparent substrate 300, wherein each of the anodes has a driving area 302a and at least one connecting areas 302b. The anodes 302 are comprised of, for example, indium tin oxide (ITO) or the other transparent material. The driving area 302a is comprised of, for example, stripes and parallel to each other. The connecting area 302b are connected to the driving area 302a.

Figure 4:
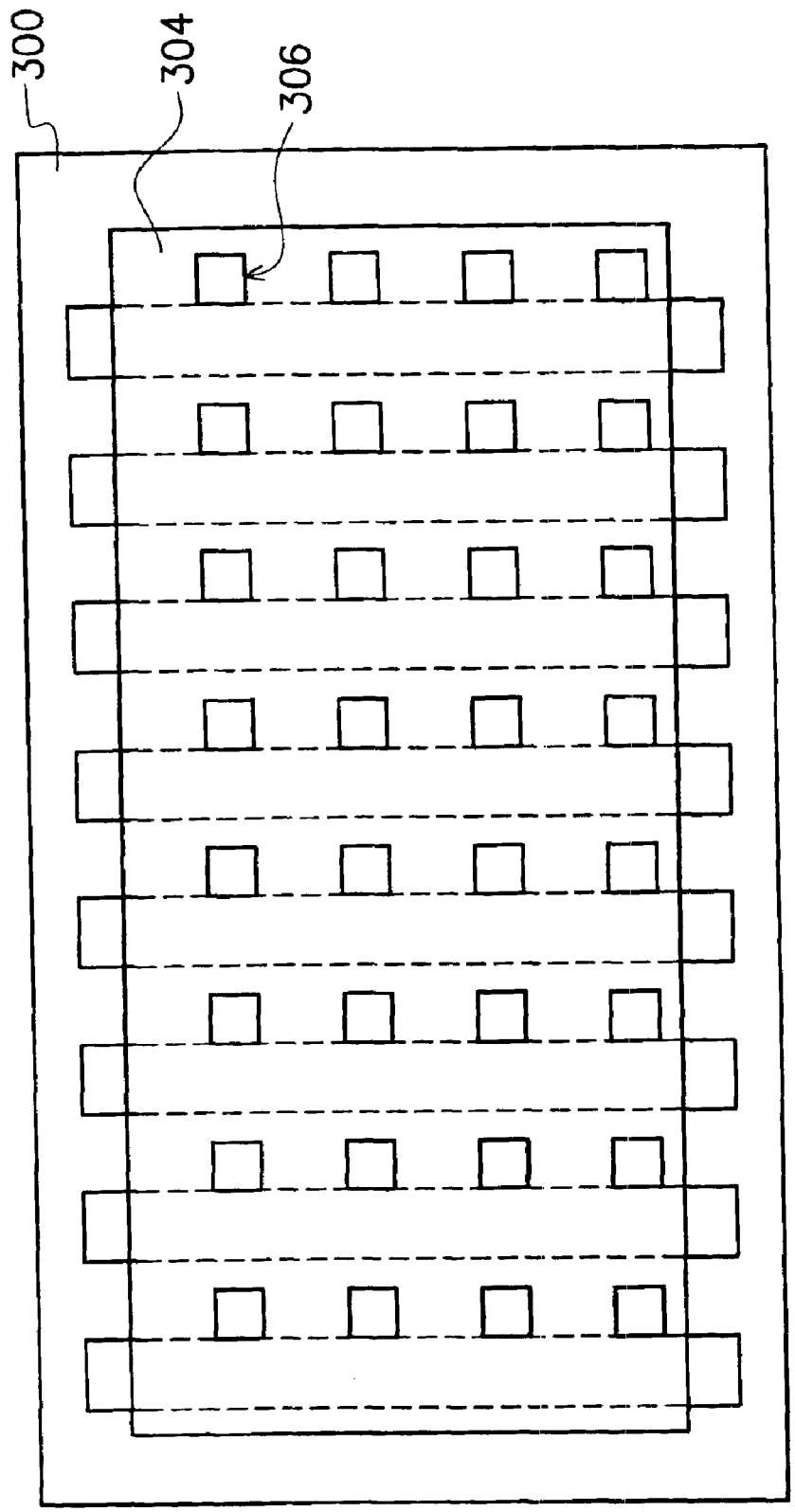

Please referring to FIG. 4, after the anodes 302 are formed over the transparent substrate 300, a patterned organic electroluminescent layer 304 is formed over the transparent substrate 300 or on the anodes 302. The patterned organic electroluminescent layer 304, for example, has a plurality of openings 306, corresponding to the connecting areas 302b. The patterned organic electroluminescent layer 304, for example, is formed over the driving areas 302a of the anodes 302 and exposes the connecting area 302b through the openings 306.

Figure 5:
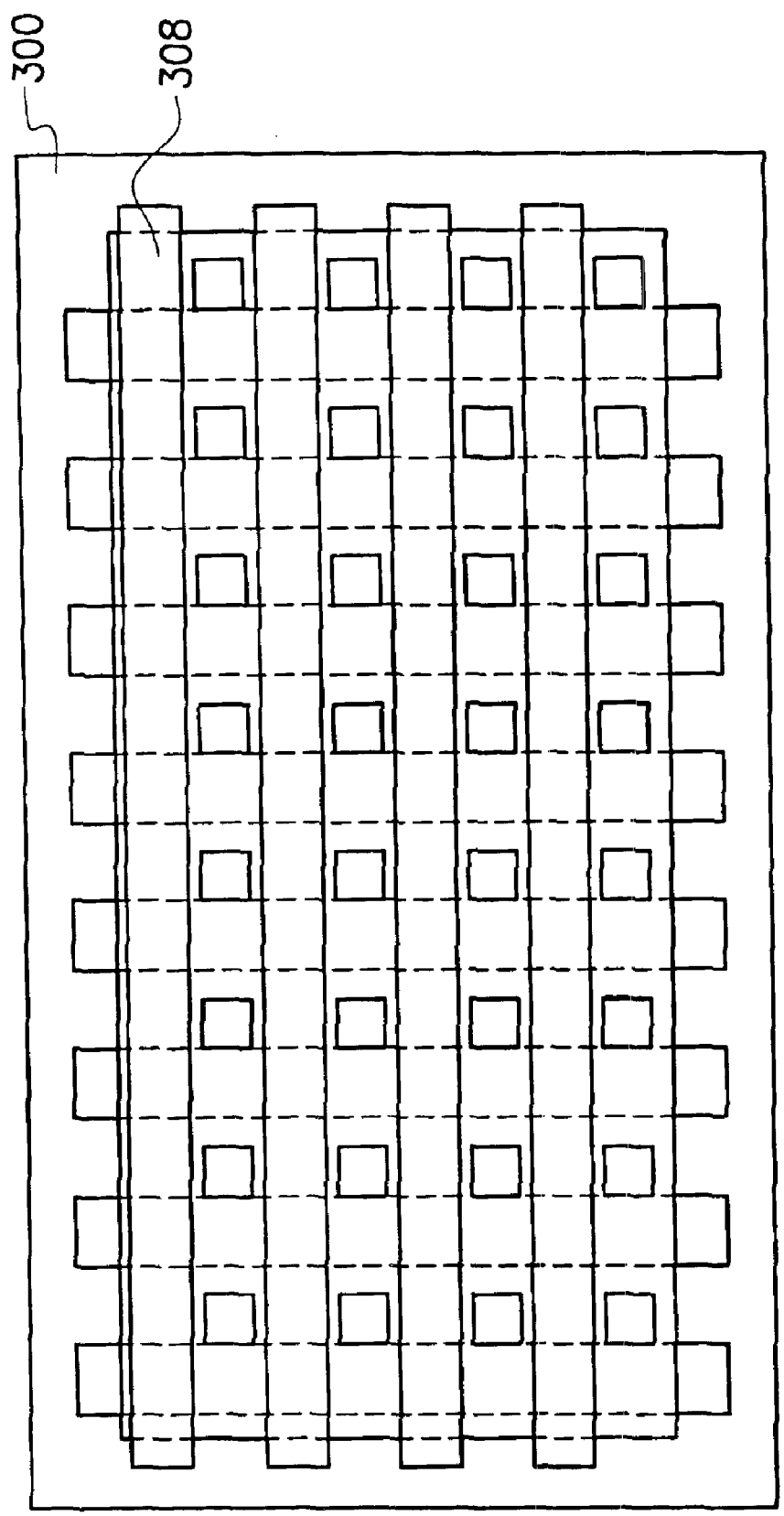

Referring to FIG. 5, after the patterned organic electroluminescent layer 304 is formed over the transparent substrate 300, a plurality of strip cathodes 308 are formed on the organic electroluminescent layer 304, wherein the strip cathodes are arranged parallel to each other. The cathodes are comprised of, for example, metal and the cathodes 308 are positioned, for example, orthogonal to the anodes 302. In addition, at least a portion of the cathodes 308 do not cover connecting areas 302b that are exposed by the openings 306.

Figure 6:
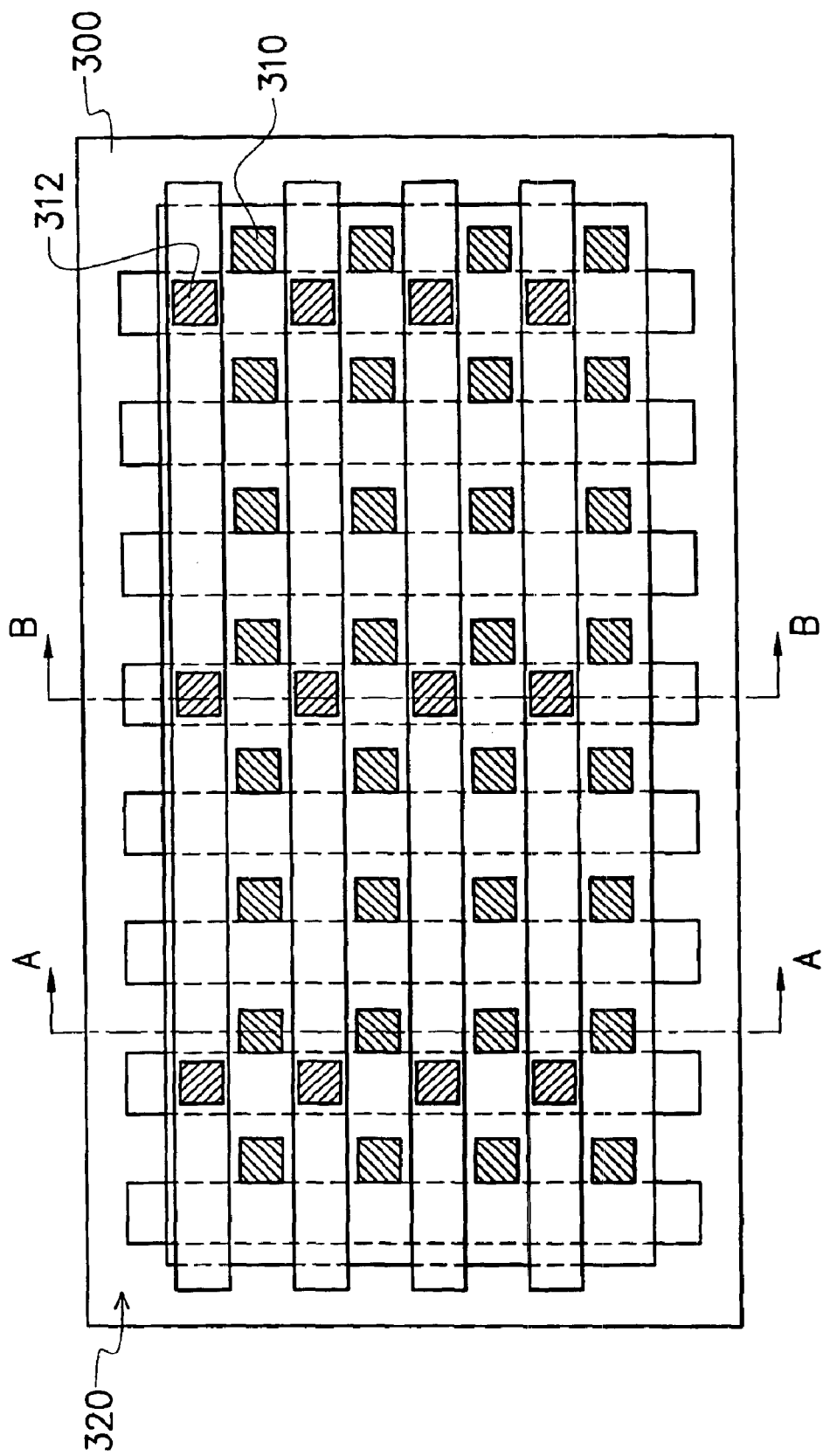

Referring to FIG. 6, after the cathodes 308 are formed over the organic electroluminescent layer 304, a protective layer 320 is formed, wherein the protective layer 320 has a plurality of openings 322 (not shown) corresponding to the connecting areas 302b. The protective layer is, for example, composed of an organic moisture resistant layer 320a and an inorganic moisture resistant layer 320b. The organic moisture resistant layer 320a is formed with a thickness from about 1000 nm to 6000 nm and the inorganic moisture resistant layer 320b is formed with a thickness from about 100 nm to 600 nm. The organic moisture resistant layer 320a is comprised of, for example, parylene, fluorine-containing resin or the other polymer. The inorganic moisture resistant layer 320b is, for example, silicon nitride, silicon oxide or aluminum nitride.

Polysolder interconnections 310 are formed over the connecting areas 302b that are exposed by the openings 322 and at least one polysolder interconnection 312 is formed on an appropriate position of the cathodes 308. The polysolder interconnections 310 and 312 are comprised of, for example, silver paste, which has a reflow temperature of about 100° C. or other material having a low reflow temperature. The polysolder interconnections 310 electrically connect with the connecting areas 302b, and the polysolder interconnection 312 electrically connects with the cathodes 308. The anodes 302 can electrically connect with the external circuits by the polysolder interconnections 310 and the cathodes 308 can electrically connect with the external circuits by the polysolder interconnection 312. Moreover, the polysolder interconnections 310 and 312 constitute a polysolder interconnection array.

Figure 7A:
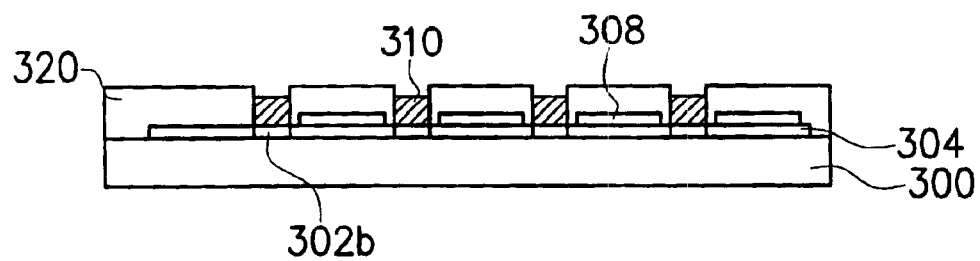
FIGS. 7A and 7B are schematic cross-sectional views showing an organic electroluminescent panel according to the first embodiment of the present invention.
Figure 7B:
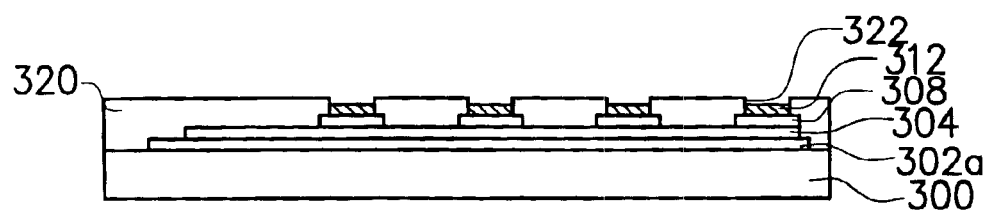

Referring to FIGS. 7A and 7B, schematic cross-sectional views showing an organic electroluminescent panel according to the first embodiment of the present invention is shown. FIG. 7A is a schematic cross-sectional view of the FIG. 6 taken along line A—A and FIG. 7B is a schematic cross-sectional view of the FIG. 6 taken along line B—B. As shown in FIG. 7A, the anodes 302 electrically connect with the external circuits by the polysolder interconnections 310. The cathodes 308 can electrically connect with the external circuits by the polysolder interconnection 312 as shown in FIG. 7B.

Figure 8A:
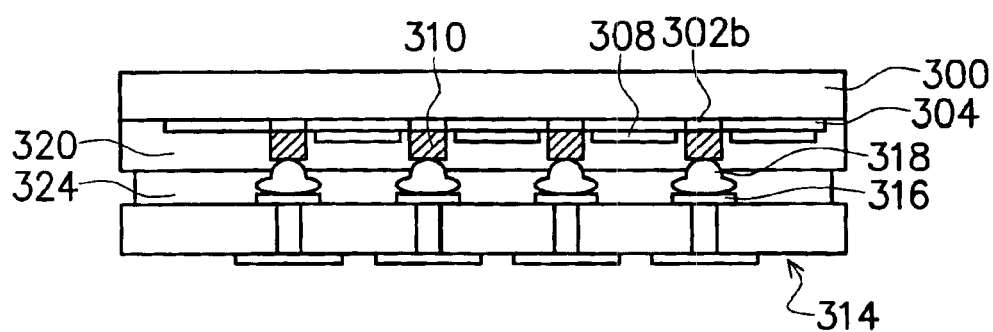
FIGS. 8A and 8B are schematic cross-sectional views showing a package of the organic electroluminescent panel according to the first embodiment of the present invention.
Figure 8B:
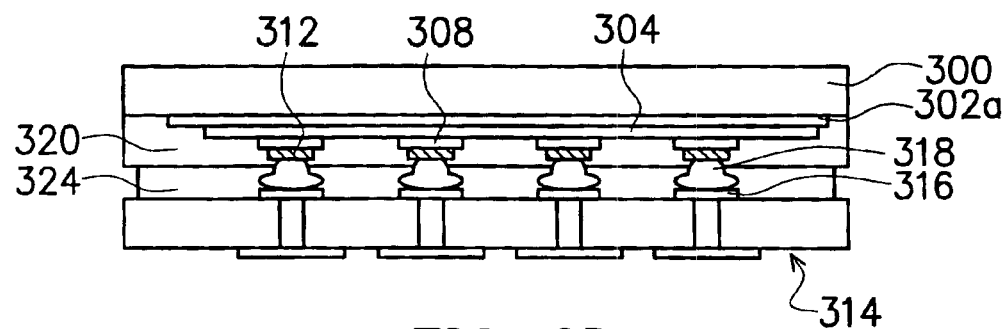

Referring to FIGS. 8A and 8B, schematic cross-sectional views showing a package of the organic electroluminescent panel according to the first embodiment of the present invention is shown. The package of the organic electroluminescent panel is comprised of a printed circuit board 314, at least one organic electroluminescent layer, a plurality of bumps 318 and a filler 324. The polysolder interconnections 310 and 312 exposed by the openings 322 of the protective layer 320 are formed as a polysolder interconnection array on the organic electroluminescent panel. The printed circuit board 314 has a plurality of bonding pads 316 and traces corresponding thereto. Bumps 318 and the filler 324, for example, are formed between the bonding pads 316 and the polysolder interconnections 310 and 312. The filler 324 is, for example, hydrophobic material which prevents moisture immersion and reduces stress. In the embodiment, a plurality of organic electroluminescent panels can be assembled on the printed circuit board 314 for resolving the limitation of package size.

In the embodiment, the process of packaging an organic electroluminescent panel is described. First, a printed circuit board 314 is provided, which has a plurality of bonding pads 316. A plurality of bumps 318 are then formed on the bonding pads 316 via a wiring bonder for forming stud bumps. The bumps can be comprised of, for example, gold bumps. One of ordinary skill in the art will understand that the bumps are not limited to the gold stud bump, it can be comprised of any other material or have any shape. After the bumps 318 are formed, the filler 324 is formed over the printed circuit board 314 by performing a screen printing, dispensing or coating process.

At least one organic electroluminescent panel comprising the polysolder interconnections 310 and 312 are flipped so that the polysolder interconnections 310 and 312 will face to the printed circuit board 314 and align to the bumps 318. A reflow or baking process is performed for electrically connecting the polysolder interconnections 310 and 312 with the bumps 318. The filler 324 is crosslinked by thermal curing or ultraviolet curing process. Because of the low reflow temperature of the polysolder interconnections 310 and 312, the connection of the organic electroluminescent panel and the printed circuit board 314 can be processed below 100° C., which is suitable for the low temperature requirement of the organic electroluminescent panel.

Additionally, the printed circuit board 314 is comprised of, for example, a ceramic printed circuit board having good thermal dissipation characteristics. Therefore, this also facilitate in the thermal dissipation of the organic electroluminescent panel.

Figure 9:
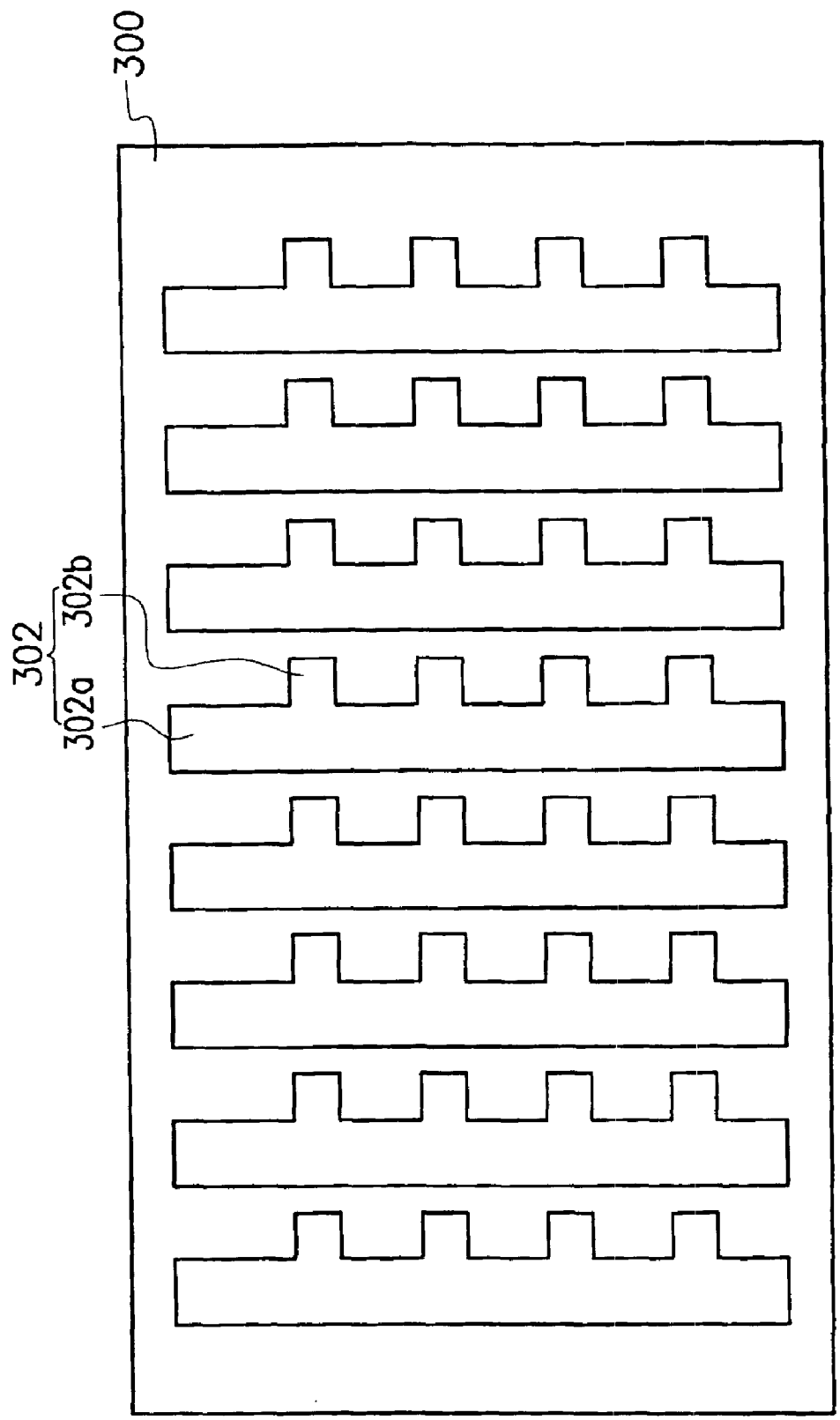
FIGS. 9–12 are a schematic views showing the progression steps of a process of forming an organic electroluminescent panel according to second embodiment of the present invention.

Referring to FIGS. 9–12, schematic views showing the progression of steps of a process of forming an organic electroluminescent panel according to a second embodiment of the present invention is shown. Referring to FIG. 9, a transparent substrate 300 is provided, which is comprised of, for example, glass, acrylic or the other transparent material. A plurality of anodes 302 are formed on the transparent substrate 300, each of the anodes 302 comprises a driving area 302a and at least one connecting areas 302b. The anodes 302 are comprised of, for example, indium tin oxide (ITO) or the other transparent material. The driving areas 302a are, for example, stripes and are arranged parallel to each other. The connecting areas 302b are connected to the driving areas 302a, serving for connection to external circuits.

Figure 10:
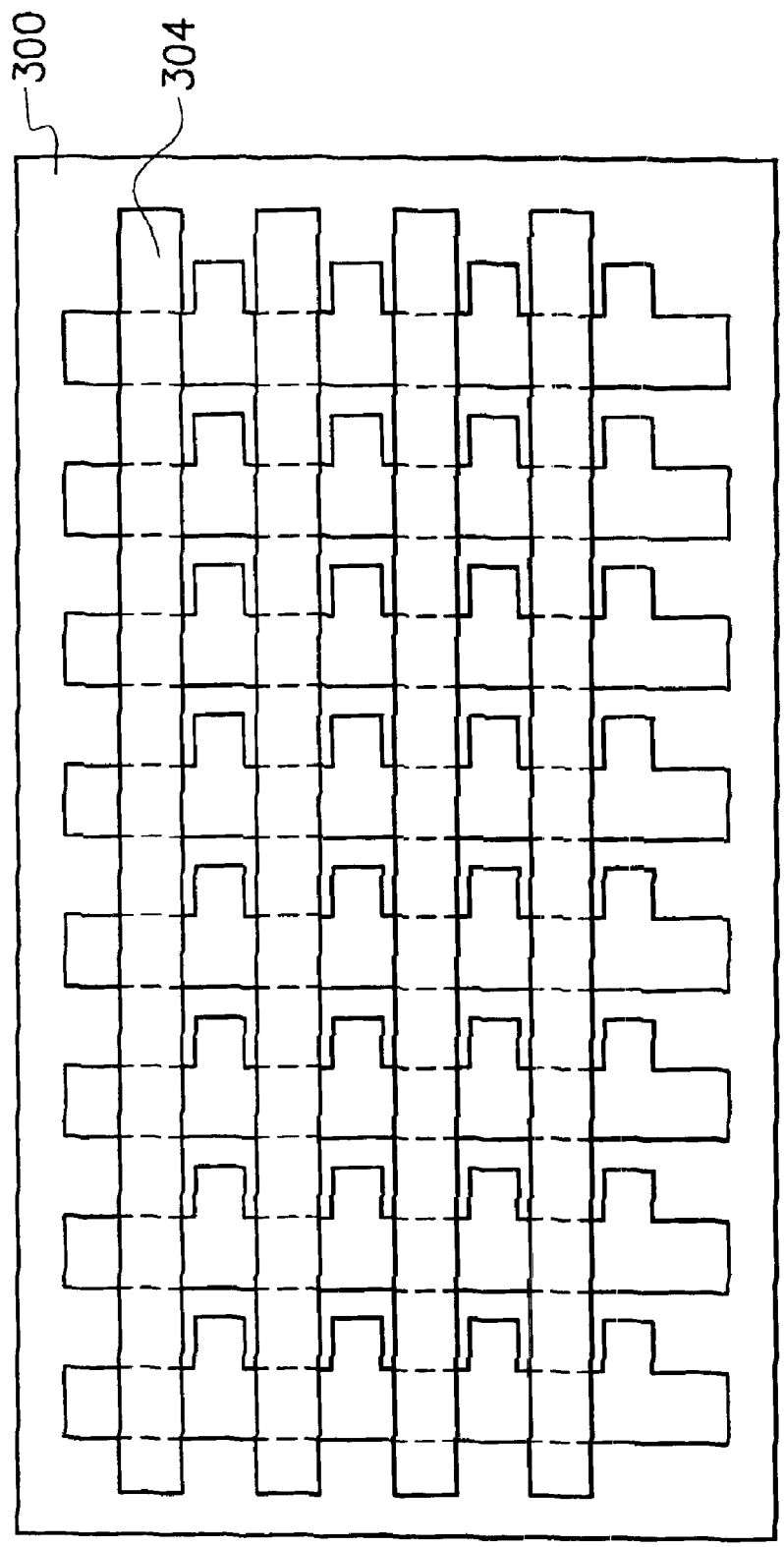

Referring to FIG. 10, after the anodes 302 are formed over the transparent substrate 300, a patterned organic electroluminescent layer 304 is formed over the transparent substrate 300. The patterned organic electroluminescent layer 304, for example, has a plurality of openings 306, corresponding to the connecting areas 302b. The patterned organic electroluminescent layer 304, for example, is formed over the driving areas 302a of the anodes 302 and exposes the connecting area 302b by the openings 306.

Figure 11:
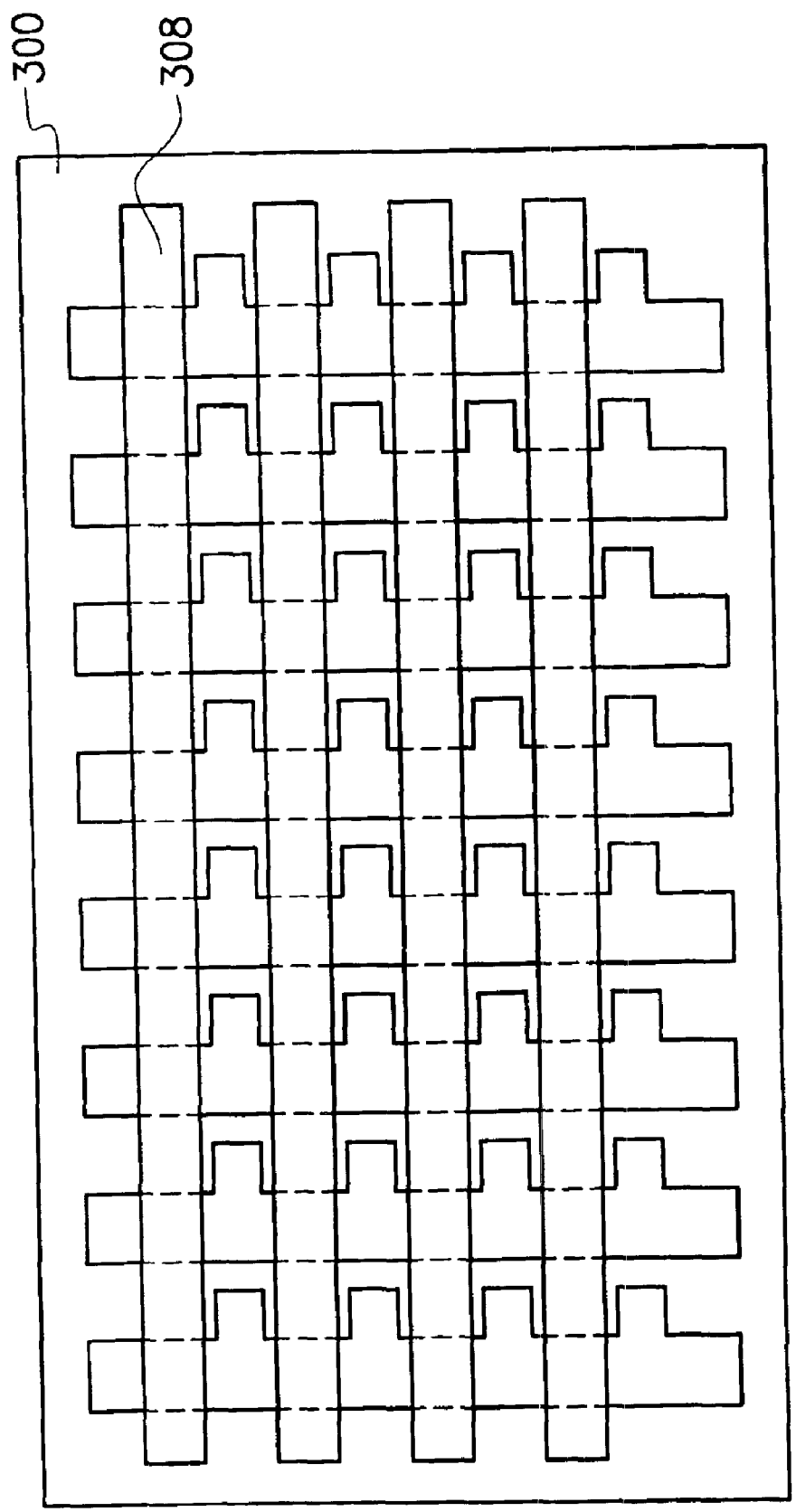

Please referring to FIG. 11, after the patterned organic electroluminescent layer 304 is formed, a plurality of strip cathodes 308 are formed over the organic electroluminescent layer 304, wherein the strip cathodes are arranged parallel to each other. The cathodes are comprised of, for example, metal and the cathodes 308 are positioned, for example, orthogonal to the anodes 302. In addition, the at least a portion of cathodes 308 do not cover connecting areas 302b exposed by the openings 306.

Figure 12:
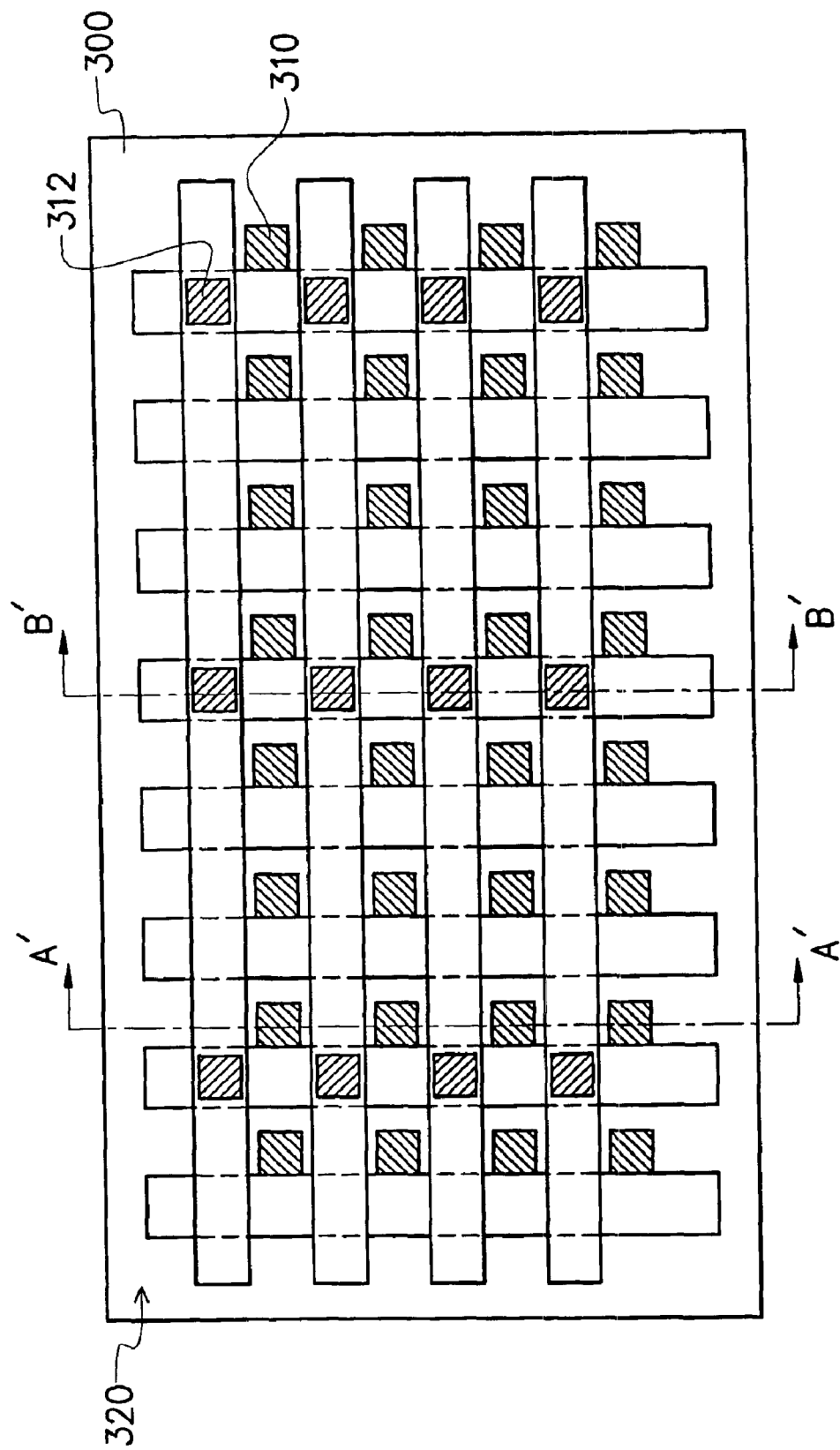

Referring to FIG. 12, after the cathodes 308 are formed over the transparent substrate 300, a protective layer 320 is formed over the cathodes 308, wherein the protective layer 320 has a plurality of openings 322 corresponding to the connecting areas 302b. The protective layer 320 is, for example, composed of an organic moisture resistant layer 320a and an inorganic moisture resistant layer 320b. The organic moisture resistant layer 320a is formed with a thickness from about 1000 nm to 6000 nm and the inorganic moisture resistant layer 320b is formed with a thickness from about 100 nm to 600 nm. The organic moisture resistant layer 320a is comprised of, for example, parylene, fluorine-containing resin or the other polymer. The inorganic moisture resistant layer 320b is comprised of, for example, silicon nitride, silicon oxide or aluminum nitride.

The polysolder interconnections 310 are formed on the connecting areas 302b exposed by the openings 322 and at least one polysolder interconnection 312 is formed on an appropriate position of the cathodes 308. The polysolder interconnections 310 and 312 are, for example, silver paste, which has a reflow temperature about 100° C. or the other material having a low reflow temperature. The polysolder interconnections 310 electrically connect with the connecting areas 302b and the polysolder interconnection 312 electrically connects with the cathodes 308. The anodes 302 can electrically connect with the external circuits by the polysolder interconnections 310 and the cathodes 308 can electrically connect with the external circuits by the polysolder interconnection 312. Moreover, the polysolder interconnections 310 and 312 constitute a polysolder interconnection array.

Figure 13A:
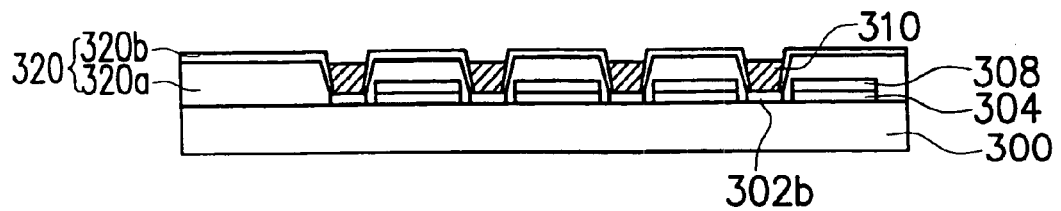
FIGS. 13A and 13B are schematic cross-sectional views showing the progression of steps of forming an organic electroluminescent panel according to the second embodiment of the present invention.
Figure 13B:
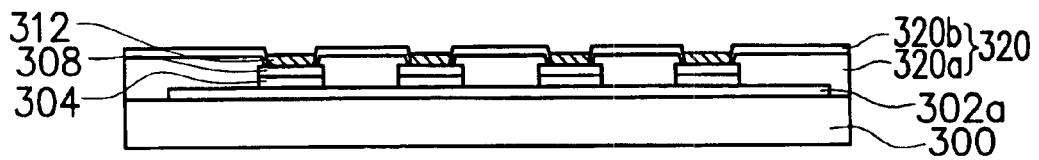

Referring to FIGS. 13A and 13B, schematic cross-sectional views the organic electroluminescent panel according to the second embodiment of the present invention are shown. FIG. 13A is a schematic cross-sectional view of the FIG. 12 taken along line A'—A' and FIG. 13B is a schematic cross-sectional view of the FIG. 12 taken along line B'—B'. As shown in FIG. 13A, the anodes 302 electrically connect with the external circuits by the polysolder interconnections 310. The cathodes 308 can electrically connect with the external circuits by the polysolder interconnection 312 as shown in FIG. 13B.

Figure 14A:
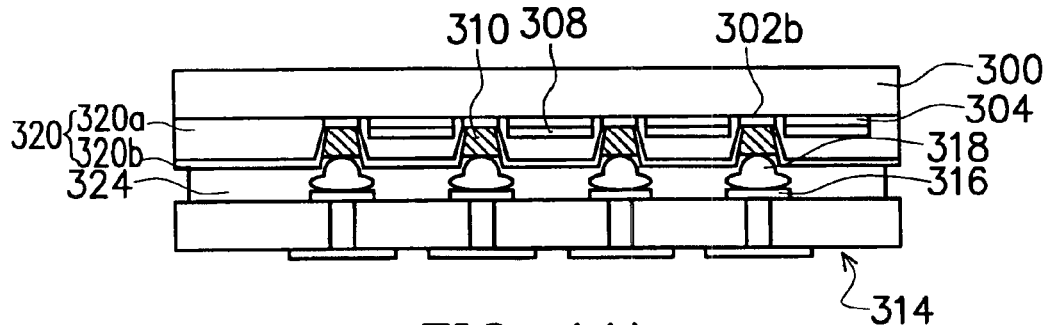
FIGS. 14A and 14B are schematic cross-sectional views showing a package of the organic electroluminescent panel according to the second embodiment of the present invention.
Figure 14B:
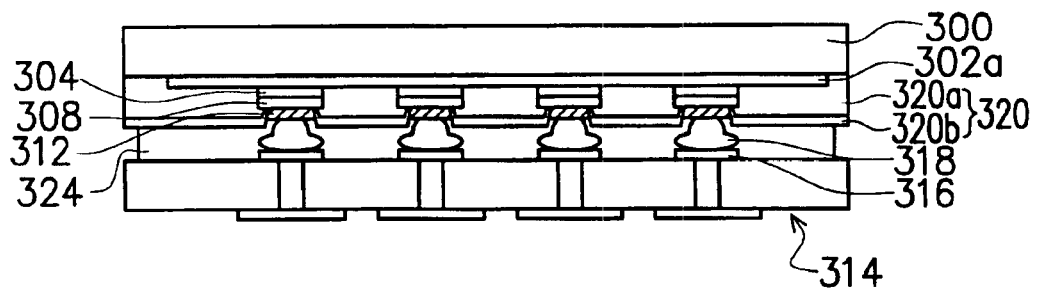

Referring to FIGS. 14A and 14B, schematic cross-sectional views of the package of the organic electroluminescent panel according to the second embodiment are shown. The package of the organic electroluminescent panel shown in FIGS. 14A and 14B is similar to that shown in FIGS. 8A and 8B except for the design of the electroluminescent layer 304. As shown in FIGS. 8A and 8B, the connecting areas 302b are exposed by the openings 306 of the patterned organic electroluminescent layer 304. However, in this embodiment, the areas 302b are exposed by the strips of the patterned organic electroluminescent layer 304.

The package of the organic electroluminescent panel is comprised of a printed circuit board 314, at least one organic electroluminescent panel, a plurality of bumps 318 and a filler 324. The polysolder interconnections 310 and 312 exposed by the openings 322 of the protective layer 320 are formed as a polysolder interconnection array on the organic electroluminescent panel. The printed circuit board 314 has a plurality of bonding pads 316 and traces in response thereto. The bumps 318 and the filler 324, for example, are formed between the bonding pads 316 and the polysolder interconnections 310 and 312. The filler 324 is comprised of, for example, a hydrophobic material, which prevents moisture and reduces stress. In the embodiment, a plurality of organic electroluminescent panels can be assembled on the printed circuit board 314 for resolving the limitation of package size.

Figure 15A:
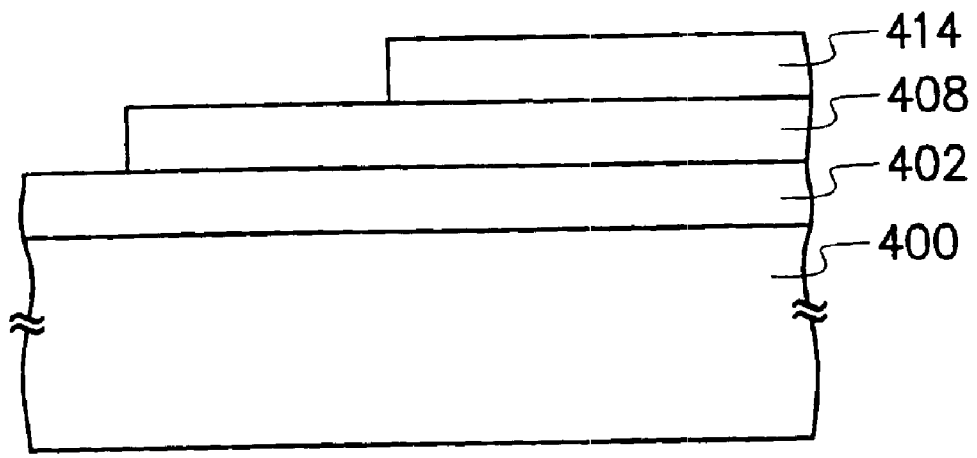
FIGS. 15A–15D are schematic cross-sectional views showing a process of forming an organic electroluminescent panel according to the first and second embodiments of the present invention.
Figure 15B:
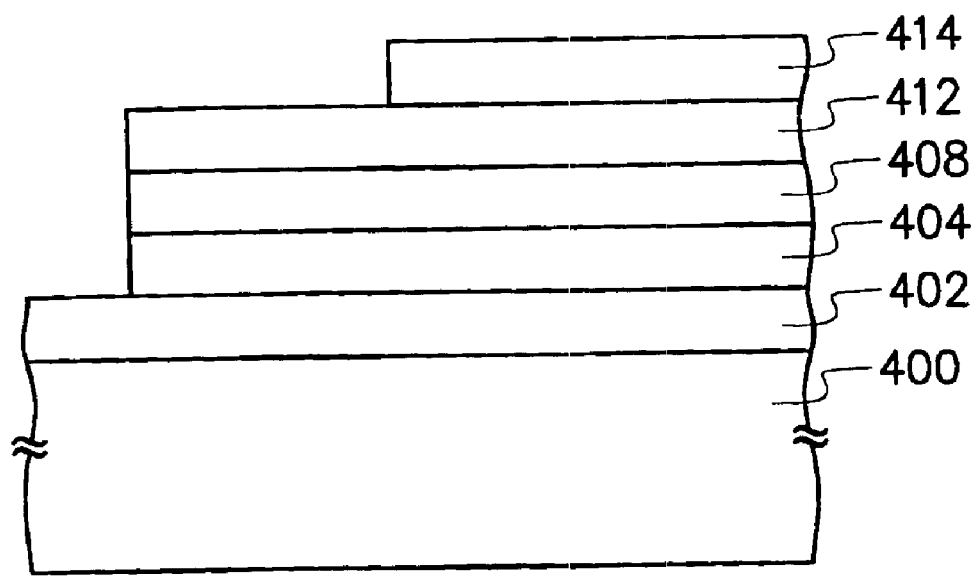

Referring to FIGS. 15A and 15B, schematic cross-sectional views showing the progression steps of a process of forming an organic electroluminescent panel according to the first and second embodiments of the present invention is shown. In these embodiments, although an organic electroluminescent panel having single electroluminescent layer, i.e., an organic electroluminescent layer 304 formed between anodes 302 and cathodes 308 is described, one having ordinary skill in the art will conceive that the organic electroluminescent panel of the present invention also be applied to a multi-layer organic electroluminescent panels.

Figure 15C:
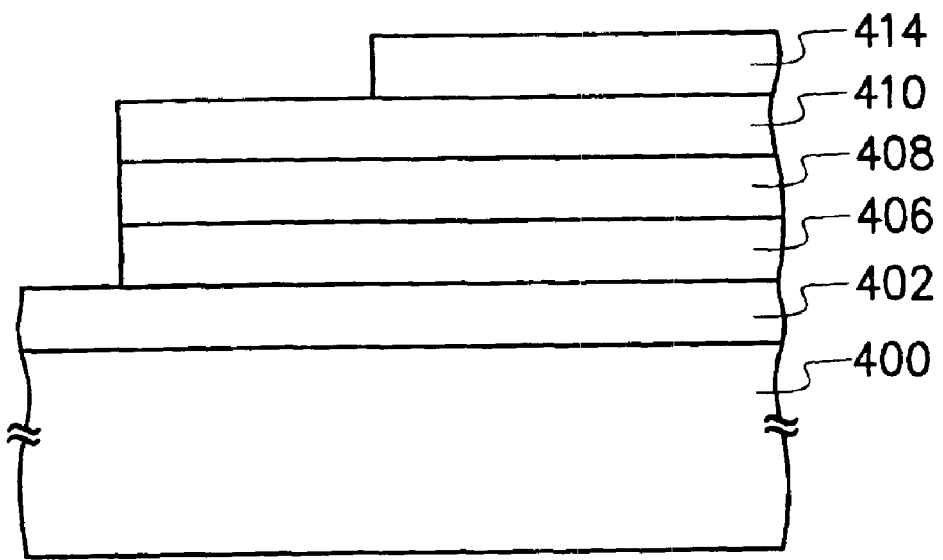
Figure 15D:
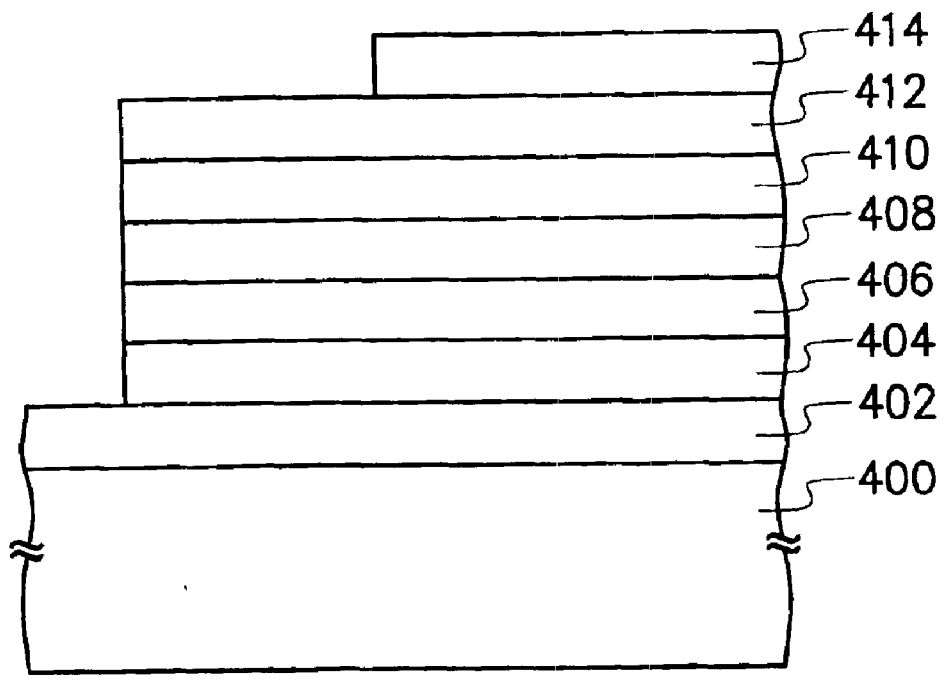

FIG. 15A shows a single-layer organic electroluminescent panel having a transparent substrate 400, the anodes 402, the organic electroluminescent layer 408 and the cathodes 414. FIG. 15B shows a three-layer organic electroluminescent panel having a transparent substrate 400, the anodes 402, the hole injection layer 404, the organic electroluminescent layer 408, the electron injection layer 412 and the cathodes 414. FIG. 15C shows a three-layer organic electroluminescent panel having a transparent substrate 400, the anodes 402, the hole transporting layer 406, the organic electroluminescent layer 408, the electron transporting layer 410 and cathodes 414. FIG. 15D shows a five-layer organic electroluminescent panel having a transparent substrate 400, the anodes 402, the hole injection layer 404, hole transporting layer 406, the organic electroluminescent layer 408, the electron transporting layer 410, the electron injection layer 412 and cathodes 414.

Accordingly, the process of packaging an organic electroluminescent panel of the present invention has following advantages:

1. The process of packaging an organic electroluminescent panel of the present invention can integrate several panels into one integral unit. Therefore, a larger size organic electroluminescent panel can be formed.

2. The process of packaging an organic electroluminescent panel of the present invention has low reflow temperature. The connection of the organic electroluminescent panel and the printed circuit board can be processed below 100° C., which is suitable for the low temperature requirement of the organic electroluminescent panel.

3. The process of packaging an organic electroluminescent panel of the present invention uses a ceramic printed circuit board which can improve the thermal dissipation characteristics.

4. The process of packaging an organic electroluminescent panel of the present invention uses the connection of the bumps and polysolder interconnections which reduces the routing of the circuit and can minimize the package size of the organic electroluminescent panel.

5. The process of packaging an organic electroluminescent panel of the present invention uses hydrophobic material which can prevent moisture and reduce the stress.

6. The process of packaging an organic electroluminescent panel of the present invention uses a protective layer for improving the package reliability.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A process of packaging an organic electroluminescent panel, the electroluminescent panel comprising a transparent substrate, a plurality of anodes formed on the transparent substrate, wherein each of the anodes has a driving area and at least one connecting area laterally connected to the driving area, a patterned organic electroluminescent layer formed on the transparent substrate or on the anodes, wherein the patterned organic electroluminescent layer exposes the connecting area, a plurality of cathodes formed on the organic electroluminescent layer, wherein at least a portion of cathodes exposes the connecting area, a protective layer having a plurality of first openings formed on the transparent substrate, wherein the first openings expose the connecting area and a portion of the cathodes, and a plurality of polysolder interconnections formed on exposed connecting area and the portion of the cathode for forming a polysolder interconnection array, the process comprising:

providing a printed circuit board having a plurality of bonding pads;

forming a plurality of bumps on the bonding pads;

forming a filler on the printed circuit board; disposing at least one organic electroluminescent panel on the printed circuit board;

performing a reflow process for electrically connecting the polysolder interconnections with the bumps; and crosslinking the filler.

2. The process of packaging an organic electroluminescent panel of claim 1, wherein the bumps are formed on the bonding pads via a wiring bonder.

3. The process of packaging an organic electroluminescent panel of claim 1, wherein the polysolder interconnections are comprised of silver paste.

4. A method of forming an organic electroluminescent panel, comprising:

providing a transparent substrate;

forming a plurality of anodes on the transparent substrate, wherein each of the anodes has a driving area and at least one connecting area laterally connected to the driving area;

forming a patterned organic electroluminescent layer on the transparent substrate or on the anodes, wherein the patterned organic electroluminescent layer exposes the connecting area;

forming a plurality of cathodes on the organic electroluminescent layer, wherein at least a portion of cathodes exposes the connecting area;

forming a protective layer on the transparent substrate, wherein the protective layer comprises a plurality of first openings and wherein the first openings expose the connecting area and a portion of the cathodes; and forming a plurality of polysolder interconnections on exposed connecting area and the portion of the cathode for forming a polysolder interconnection array.

5. The method of forming an organic electroluminescent panel of claim 4, wherein the anodes are comprised of indium tin oxide.

6. The method of forming an organic electroluminescent panel of claim 4, wherein the cathodes are comprised of metal.

7. The method of forming an organic electroluminescent panel of claim 4, wherein the polysolder interconnections are comprised of silver paste.

8. The method of forming an organic electroluminescent panel of claim 4, wherein the method of forming the polysolder interconnections comprises a screen printing process or a dispensing process.

9. The method of forming an organic electroluminescent panel of claim 4, wherein the method of forming the patterned organic electroluminescent layer comprises:

forming an organic electroluminescent layer; and defining the organic electroluminescent layer for forming a plurality of second openings thereon, wherein the second openings expose the connecting area.

10. The method of forming an organic electroluminescent panel of claim 4, wherein the method of forming the patterned organic electroluminescent layer comprises:

forming an organic electroluminescent layer; and defining the organic electroluminescent layer for forming a plurality of strips thereof and exposing the connecting area.

11. The method of forming an organic electroluminescent panel of claim 4, further comprising forming a hole injection layer between the anodes and the organic electroluminescent layer after forming the anodes and before forming the organic electroluminescent layer.

12. The method of forming an organic electroluminescent panel of claim 11, wherein further comprising forming a hole transporting layer between the hole injection layer and the organic electroluminescent layer after forming the hole injection layer and before forming the organic electroluminescent layer.

13. The method of forming an organic electroluminescent panel of claim 4, further comprising forming an electron injection layer between the cathodes and the organic electroluminescent layer after forming the organic electroluminescent layer and before forming the cathodes.

14. The method of forming an organic electroluminescent panel of claim 13, wherein further comprising forming an electron transporting layer between the electron injection layer and the organic electroluminescent layer after forming the organic electroluminescent layer and before forming the electron injection layer.

15. The method of forming an organic electroluminescent panel of claim 4, wherein the method of forming the protective layer comprises:

forming an organic moisture resistant layer; and forming an inorganic moisture resistant layer on the organic moisture resistant layer.

* * * * *